(12) United States Patent
Furukawa (10) Patent No.: US 7,071,721 B2
(45) Date of Patent: Jul. 4, 2006

(54) DEVICE AND METHOD FOR ELECTRONIC DEVICE TEST

(75) Inventor: Yasuo Furukawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/440,754

(22) Filed: May 19, 2003

(65) Prior Publication Data

US 2004/0004493 A1    Jan. 8, 2004

Related U.S. Application Data (63) Continuation of application No. PCT/JP01/09895, filed on Nov. 13, 2001.

(30) Foreign Application Priority Data

Nov. 20, 2000  (JP)  ............................... 2000-352442
Feb. 12, 2002  (WO)  ................................. 02/41390

(51) Int. Cl.
    *G01R 31/26*  (2006.01)
(52) U.S. Cl. .................................................. 324/765
(58) Field of Classification Search ................ 324/765, 324/754, 755, 158.1, 760, 761; 714/734, 714/741, 724
    See application file for complete search history.

(56) References Cited

U.S. PATENT DOCUMENTS 5,070,297 A * 12/1991 Kwon et al. ................. 324/754
6,151,695 A * 11/2000 Kamo et al. ................. 714/734
6,380,755 B1 * 4/2002 Sato ............................ 324/765
6,400,173 B1 * 6/2002 Shimizu et al. ............. 324/765
6,512,392 B1 * 1/2003 Fleury et al. ................ 324/765

FOREIGN PATENT DOCUMENTS

JP       57-59450       4/1982
JP       8-147369       6/1996
JP       2000-353727    12/2000

OTHER PUBLICATIONS

Patent Abstracts of Japan, Publication No. 08-147396, Publication Date: Jun. 7, 1996, 2 pages.
Patent Abstracts of Japan, Publication No. 2000-353727, Publication Date: Dec. 19, 2000, 2 pages.
Translation of International Preliminary Examination Report dated Oct. 29, 2002 (5 pgs.).

* cited by examiner

*Primary Examiner*—Jermele Hollington
*Assistant Examiner*—Tung X. Nguyen (57) ABSTRACT

A test device tests acceptability of a plurality of electronic devices formed on a wafer. The test device includes: a pattern supply part for supplying test patterns to each of the plurality of electronic devices; a power supply for applying power supply voltage to each of the plurality of electronic devices; a measurement part for measuring the data indicating the operations of each of the electronic devices generated by the test patterns; a calculation part for calculating the reference values for judging the acceptability of each of the electronic devices; and a judgment part for judging the acceptability of each of the electronic devices.

18 Claims, 6 Drawing Sheets

DEVICE AND METHOD FOR ELECTRONIC DEVICE TEST

The present application is a continuation application of PCT/JP01/09895 filed on Nov. 13, 2001, claiming priority from a Japanese patent application No. 2000-352442 filed on Nov. 20, 2000, the contents of which are incorporated herein by reference.

BACKGROUND OF THE INVENTION

1. Field of the Invention

The present invention relates to a test device and a test method for testing electronic devices. More particularly, the present invention relates to the testing device and the test method for testing a plurality of electronic devices formed on a wafer.

2. Description of Related Art

For acceptability judgment of the electronic device, a method of supplying a test pattern to an electronic device and measuring data, such as IDDQ current value (quiescent supply current), has been used. The acceptability judgment of the electronic device is done by comparing the measured data of the electronic device with an expected data which is to be output from the electronic device.

However, since leakage current from such as elements and wiring in the device increases with the miniaturization of an electronic device, it is difficult to measure the acceptability of each of the electronic devices accurately by the conventional measuring method.

SUMMARY OF THE INVENTION

Therefore, it is an object of the present invention to provide a test device which can solve the foregoing problem. The above and other objects can be achieved by combinations described in the independent claims. The dependent claims define further advantageous and exemplary combinations of the present invention.

According to the first aspect of the present invention, there is provided a test device for testing a plurality of electronic devices formed on a wafer. The test device includes: a pattern supply part for supplying a test pattern to each of the plurality of electronic devices; a measurement part for measuring data indicating operation of each of the electronic devices generated from the test pattern; and a judgment part for judging acceptability of other electronic devices based on the data of at least one of the electronic devices among the plurality of electronic devices.

The test device may further include a calculation part for calculating a reference value for judging the acceptability of each of the electronic devices using the data of the plurality of electronic devices. The judgment part may judge the acceptability of each of the electronic devices using the reference value and the data of each of the electronic devices.

The calculation part may select an electronic device used for calculation of the reference value, and may calculate the reference value using the data of the selected electronic device. The measurement part may measure a value of current flowing to the electronic devices by supplying the test pattern, and the calculation part may calculate the reference value based on the current value measured by the measurement part. The measurement part may measure analog output values output from the electronic devices.

The measurement part may further include an offset value storage part for storing an offset value of the analog output, and the calculation part may calculate the reference value based on the offset value and the data. The measurement part may measure a frequency of a signal output from the electronic devices.

The test device may further include: a data storing part for storing the data; and a heating part for heating the electronic devices. The calculation part may calculate the reference value based on the data stored in the data storing part and the data after heated by the heating part.

The test device may further include a cooling part for cooling the electronic devices after heated by the heating part. The data storing part may further store the data after heated by the heating part, and the calculation part may calculate the reference value based on at least one of the data before and after heated by the heating part, the data being stored in the data storing part, and the data after cooled by the cooling part.

The measurement part may measure a position of each of the electronic devices on the wafer in association with the data, and the judgment part may judge the acceptability of each of the electronic devices based on the position. The calculation part may divide the wafer into a plurality of areas and calculates the reference value for each of the areas, and the judgment part may judge the acceptability of the electronic devices for each of the areas.

The test device may further include a wafer data storing part for storing the data for each of wafers. The measurement part may measure the data of the plurality of wafers, the wafer data storing part may store the data of the plurality of wafers respectively, and the calculation part may calculate the reference value based on the data stored in the wafer data storing part. The plurality of wafers may be manufactured in a production lot.

According to the second aspect of the present invention, there is provided a test method for testing a plurality of electronic devices formed on a wafer. The test method includes steps of: inputting a test pattern to each of the plurality of electronic devices; measuring data indicating operation of each of the electronic devices generated from the test pattern; and judging acceptability of other electronic devices based on the data of at least one of the electronic devices among the plurality of electronic devices.

The test method may further include a step of calculating a reference value for judging the acceptability of each of the electronic devices using the data of the plurality of electronic devices. The acceptability of each of the electronic devices may be judged in the judgment step using the reference value and the data of each of the electronic devices.

A value of current flowing to the electronic devices may be measured in the measurement step by supplying the test pattern, and the reference value may be calculated in the calculation step based on the current value measured in the measurement step.

The test method may further include a step of heating the electronic devices. The reference value may be calculated in the calculating step based on the data measured in the measurement step after heating the electronic device in the heating step.

A position of each of the electronic devices on the wafer may be measured in the measurement step in association with the data, and the acceptability of each of the electronic devices may be judged in the judgment step based on the position on the wafer.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
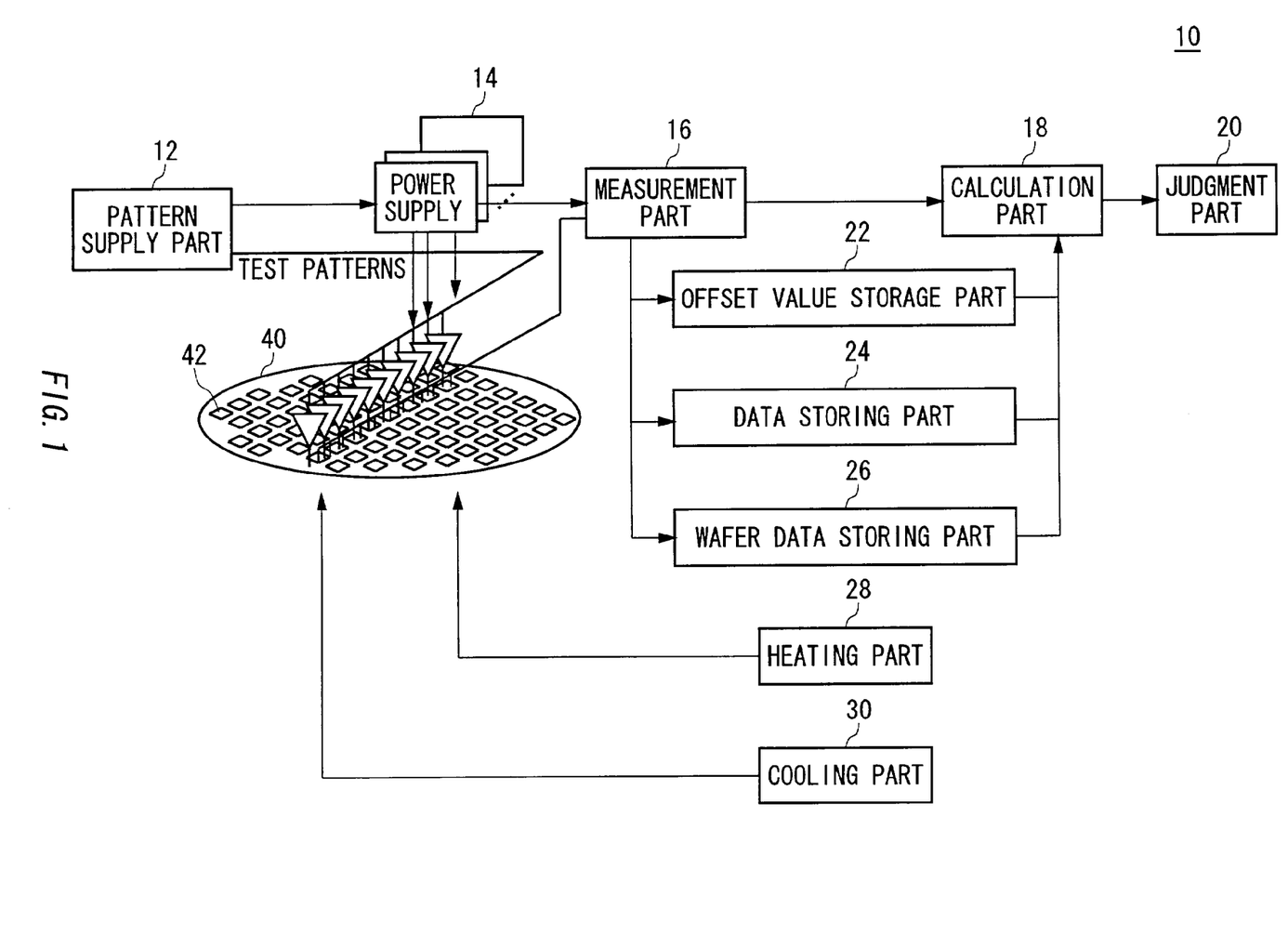
FIG. 1 is a block diagram showing a configuration of a test device according to an embodiment of the present invention.

FIG. 1 is a block diagram showing a configuration of a test device according to an embodiment of the present invention.

A test device 10 tests acceptability of a plurality of electronic devices 42 formed on a wafer 40. Here, the "electronic device" means a device for performing a predetermined operation according to applied current and/or voltage, e.g., a semiconductor device consisting of active elements such as IC (Integrated Circuit) or LSI (Large-Scale Integrated circuit). Furthermore, it also means a device which combines above-mentioned devices and integrated into a package, or a breadboard for realizing a predetermined function by mounting these devices on a printed circuit board.

The test device 10 includes: a pattern supply part 12 for supplying test patterns to each of the plurality of electronic devices 42; a power supply 14 for applying power supply voltage to each of the plurality of electronic devices 42; a measurement part 16 for measuring the data indicating the operations of each of the electronic devices 42 generated by the test patterns; a calculation part 18 for calculating the reference values for judging the acceptability of each of the electronic devices 42; and a judgment part 20 for judging the acceptability of each of the electronic devices 42.

The pattern supply part 12 connects with each of a plurality of electronic devices 42, and supplies the common test pattern to each of the electronic devices 42. In this case, it is preferable that the pattern supply part 12 supplies test patterns to a plurality of electronic devices 42 simultaneously. The pattern supply part 12 supplies the common test pattern to all of the electronic devices 42 formed on the wafer 40. Alternatively, the pattern supply part 12 supplies the common test pattern to a part of the plurality of electronic devices 42 selected from all of the electronic devices 42 formed on the wafer 40. For example, the pattern supply part 12 supplies the common test pattern to the electronic devices 42 excluding the electronic devices 42 already judged to be defective among all of the electronic devices 42 formed on the wafer 40. It is preferable that the pattern supply part 12 supplies the test pattern having comparatively lower frequency. Alternatively, the pattern supply part 12 supplies the test pattern to analog circuits of the electronic devices 42.

It is preferable that the measurement part 16 measures the data of the plurality of electronic devices 42 formed on the wafer 40 simultaneously. It is preferable that the measurement part 16 measures the current value of the current flowing to the electronic devices 42 by the pattern supply part 12 supplying the test patterns to the electronic devices 42. According to the present embodiment, the current flowing to the electronic devices 42 is IDDQ current. Alternatively, the measurement part 16 measures the analog output value output from the analog circuits of the electronic devices 42, and measures a frequency of a signal output from the electronic devices 42. Alternatively, the measurement part 16 includes a switching part for selectively measuring one of the current values of the power supply 14 and the output of the electronic device 42. The measurement part 16 may be integrated with the power supply 14, or the power supply 14 may include the measurement part 16. The measurement part 16 measures a position of each of the electronic devices 42 on the wafer 40 in association with the measurement data. In this case, it is preferable that the judgment part 20 judges the acceptability of the electronic device 42 based on the measurement data and the position.

The calculation part 18 calculates the reference value using the measurement data of the plurality of electronic devices 42 measured by the measurement part 16. For example, the calculation part 18 calculates the reference value based on the current value of the power supply 14 measured by the measurement part 16. Moreover, the calculation part 18 considers the average of the measurement data as the reference value, or considers the mode of the measurement data as the reference value. Alternatively, the calculation part 18 selects the electronic device 42 used for calculation of the reference value, and calculates the reference value using the measurement data of the selected electronic device 42. The calculation part 18 divides the wafer 40 into a plurality of areas and calculates the reference value for each of the plurality of areas. In this case, the judgment part 20 judges the acceptability of the electronic device 42 based on the reference value calculated for each of the areas.

The judgment part 20 judges the acceptability of other electronic devices based on the measurement data of at least one electronic device among the plurality of electronic devices 42. It is preferable that the judgment part 20 judges the acceptability of each of the electronic devices 42 based on a distribution of the measurement data of the plurality of electronic devices 42 formed on the wafer 40. The judgment part 20 judges the acceptability of each of the electronic devices 42 using the reference value calculated by the calculation part 18, and by the measurement data of each of the electronic devices 42.

According to the test device 10 of present embodiment, since the acceptability of each of the electronic devices is judged using the measurement data of the electronic devices 42 formed in the constant condition, the acceptability of the electronic devices, of which measurement data values change delicately, is judged accurately. Moreover, since the acceptability of each of the electronic devices is judged using the measurement data of each of the electronic devices 42 measured simultaneously in the constant condition, the electronic device, which generates abnormal measurement data among the plurality of electronic devices 42, is measured to be defective. Therefore, the acceptability of the electronic devices, of which the measurement data changes with a difference in delicate measurement condition, is measured somewhat accurately. Moreover, since the reference value is calculated based on the measurement data of the plurality of electronic devices, the acceptability of the complicated electronic devices, which generates leakage current caused by a lot of circuits, is judged somewhat accurately.

Alternatively, the test device 10 further includes an offset value storage part 22 for storing an offset value of the data measured by the measurement part 16. The data is analog output value of the electronic device 42. Alternatively, the data is the current value of the power supply 14, or the frequency of the signal output from the electronic devices 42. The offset value is data indicating the operation of a reference electronic device, which is obtained by supplying the test pattern to the reference electronic device which has been already judged to be normal by another test device or the test device 10 according to the present embodiment. The calculation part 18 calculates the reference value based on the offset value and the measurement data of the electronic device 42 measured by the measurement part 16. When whole of the wafer 40 has a failure, the defect of the wafer 40 is judged from the difference from the offset value by using the offset value of the data. Furthermore, since the test of the plurality of electronic devices is done simultaneously, even if the test pattern having lower frequency, which requires time, is to be used, overall test time is shortened. Therefore, the cost for testing can be reduced.

Alternatively, the test device 10 further includes a data storing part 24 for storing the measurement data, a heating part 28 for heating the electronic devices 42, and a cooling part 30 for cooling the electronic devices 42 after heated by the heating part 28. The heating part 28 is a heating means such as a heating furnace or a hot plate, for performing environmental tests, such as burn-in of the electronic devices 42. According to the present embodiment, the test device 10 includes a function for performing environmental tests, such as burn-in. The data storing part 24 stores the measurement data before heated by the heating part 28. The calculation part 18 calculates the reference value based on the measurement data stored in the data storing part 24 and the measurement data after heated by the heating part 28. The data storing part 24 further stores the measurement data after heated by the heating part 28. Alternatively, the calculation part 18 calculates the reference value based on at least one of the measurement data before heated by the heating part 28 and the measurement data after heated, which are stored in the data storing part 24, and the measurement data after cooled by the cooling part 30.

Since the test device 10 includes the function for performing the burn-in test, the pattern supply part 12 supplies the test pattern having low frequency, which requires time, to each of the electronic devices 42 simultaneously with the burn-in test. Therefore, overall test time is reduced and the manufacturing cost of the electronic devices 42 is reduced.

Alternatively, the test device 10 tests simultaneously a plurality of wafers 40 including the plurality of electronic devices 42 respectively. It is preferable that the plurality of wafers 40 are manufactured in a production lot. It is preferable that the measurement part 16 measures the data of the plurality of wafers 40 simultaneously. The calculation part 18 calculates the reference value using the measurement data of the plurality of electronic devices 42 of the plurality of wafers 40.

The measurement part 16 measures the data of the plurality of wafers 40 for each of the wafers 40 one by one, or measures the data of several wafers at a time among the plurality of the wafers 40. At this time, it is preferable that the test device 10 further includes a wafer data storing part 26 for storing the measurement data for each of the wafers 40. Then, it is preferable that the wafer data storing part 26 stores the measurement data of the plurality of wafers 40 respectively, and the calculation part 18 calculates the reference value based on the measurement data stored in the wafer data storing part 26. Alternatively, the wafer data storing part 26 stores the measurement data for each of the plurality of production lots. At this time, the calculation part 18 calculates the reference value based on the measurement data of the plurality of production lots stored in the wafer data storing part 26.

According to the test device 10 in the present embodiment, since the measurement data of the electronic devices 42, which are formed respectively on the plurality of wafers, are used, population parameters for calculating the reference value increases, and the acceptability of the electronic devices is judged more accurately. Furthermore, the acceptability of the wafers 40 is judged by comparing the distribution of the measurement data for each of the wafers 40. Furthermore, the acceptability of the production lots is judged by comparing the distribution of the measurement data for each of the production lots.

According to another embodiment, the test device 10 tests the plurality of packed electronic devices. In this case, it is preferable that the plurality of electronic devices are formed from a wafer. Alternatively, each of the electronic devices includes a circuit for testing the operation of itself.

Figure 2:
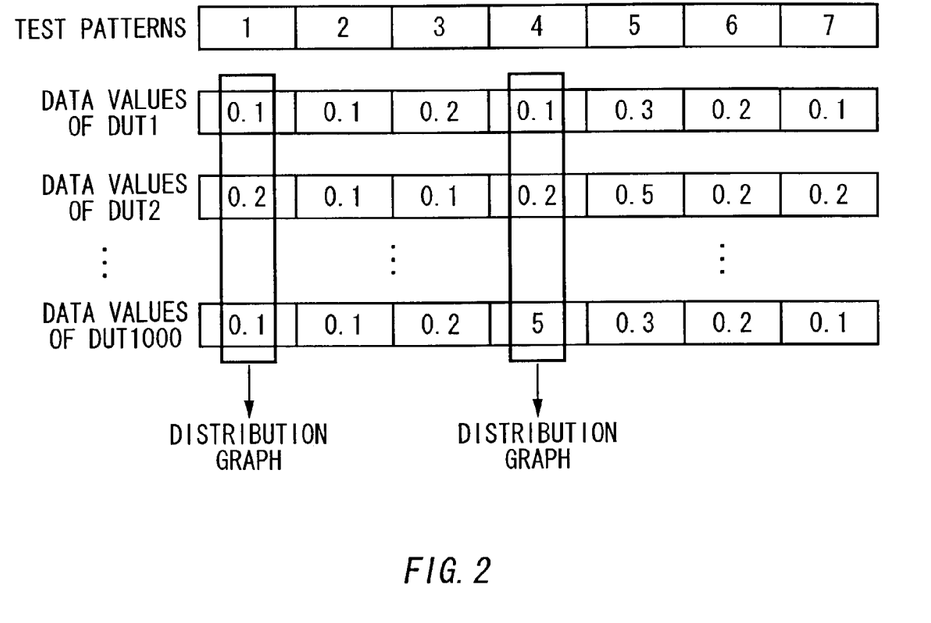
FIG. 2 is a table exemplary showing data values of data measured by the test device according to the present embodiment.

FIG. 2 is a table exemplary showing data values of data tested by the test device 10 according to the present embodiment.

The test pattern supply part 12 supplies the plurality of test patterns to the plurality of electronic devices one by one. According to the present embodiment, the test pattern supply part 12 supplies seven types of test patterns to the respective electronic devices 42. Moreover, according to the present embodiment, the judgment part 18 judges the acceptability of each of the electronic device based on the measurement data of 1000 of electronic devices 42.

FIG. 3 is graphs exemplary showing the distribution of the data values of the data tested by the test device 10 according to the present embodiment. In each of FIGS. 3A–3D, a horizontal axis indicates the data value and a vertical axis indicates the number or the frequency of the electronic devices 42 corresponding to the data value.

Figure 3A:
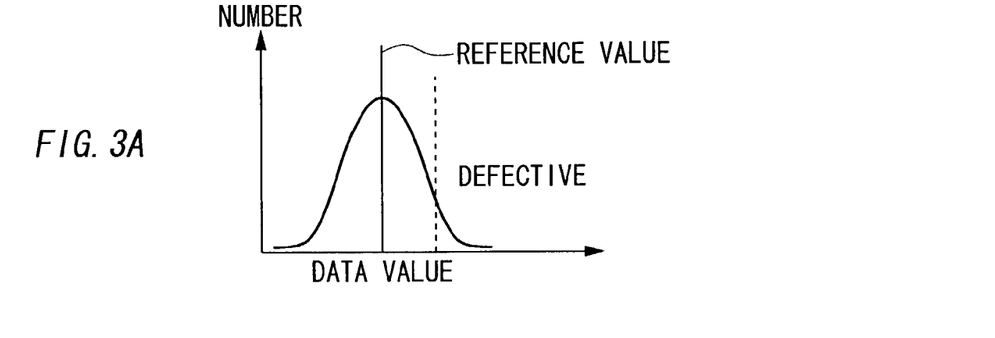
FIGS. 3A through 3D are graphs exemplary showing a distribution of the data values of the data measured by the test device according to the present embodiment.

FIG. 3A is a graph showing the distribution of the data values at the time of measuring the plurality of electronic devices 42 on the wafer 40 by the measurement part 16. The calculation part 18 calculates the reference value and the judgment part 20 judges the acceptability of the electronic devices 42 based on the reference value. The judgment part 20 judges the electronic device 42, of which the deviation from the reference value is within a predetermined range, to be normal, and judges the electronic device 42, of which the deviation from the reference value is more than the predetermined range, to be defective.

Figure 3B:
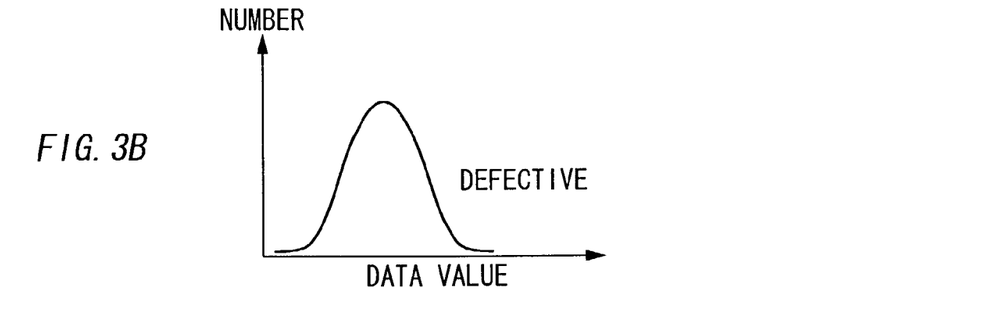

FIG. 3B is a graph showing the distribution of the data values when the measurement part 16 measures the plurality of electronic devices 42 on the wafer 40. The judgment part 20 judges a predetermined rate of the electronic devices 42 to be defective among all of the plurality of electronic devices 42, of which the data values are located at edge of the distribution curve. Alternatively, the judgment part 20 judges a predetermined rate of the electronic devices 42 having high data value to be defective.

Figure 3C:
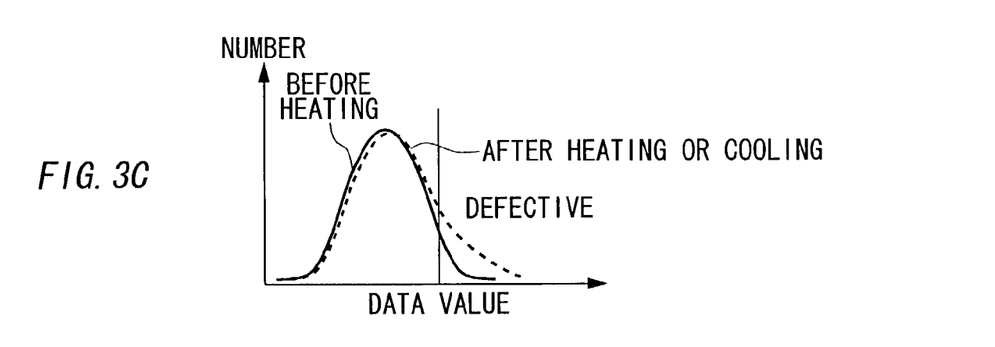

FIG. 3C is a graph showing the distribution of the data values at the time of measuring the plurality of electronic devices 42 by the measurement part 16 before and after heated by the heating part 28 and after cooled by the cooling part 30, respectively. In FIG. 3C, the distribution shown as a solid line is the data values before heating, and, the distribution shown as a dashed line is the data values after heating and after cooling. The judgment part 20 judges the electronic device 42 to be defective, of which the data value before heating is different from the data value after heating and after cooling.

Figure 3D:
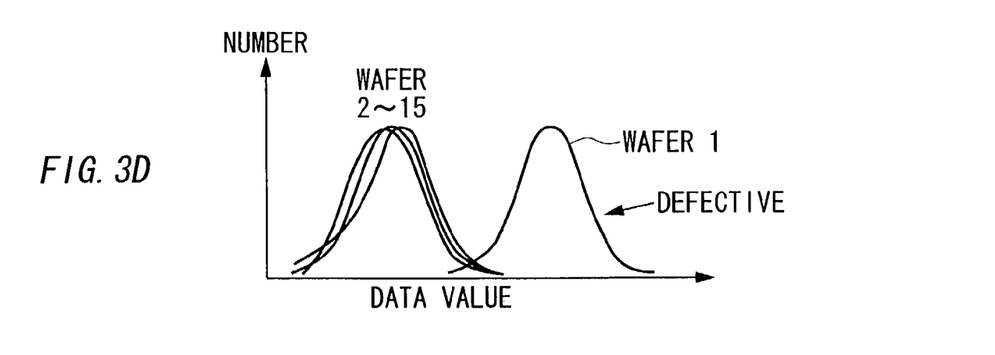

FIG. 3D is a graph showing the distribution of the data values for each of the wafers 40 when the test device 10 tests the plurality of wafers 40.1–40.15. The judgment part 20 judges the wafer 40.1 to be defective, which has a different distribution pattern of the data values from those of the plurality of wafers 40.1–40.15.

Alternatively, the judgment part 20 judges whole of the wafer 40 to be defective, of which the distribution of the data value is not a normal distribution but a plurality of peaks exists in the distribution. Alternatively, when the data values distribute broader, the judgment part 20 judges a predetermined rate of the electronic device 42, of which the data values are located at either edge of the distribution curve, to be defective. In this case, the judgment part 20 judges the wafer 40 to be defective. When the data values have a plurality of distributions including a plurality of peaks, the calculation part 18 selects only the electronic device 42, of which the data values is included in one distribution among the plurality of distributions, and calculates the reference value using the measurement data of the selected electronic device 42.

According to the test device 10 of the present embodiment, since the acceptability of each of the electronic devices 42 is judged based on the distribution of the data value of the plurality of electronic devices 42, the electronic device 42 generating the abnormal data value among the plurality of electronic devices 42 is judged to be defective.

Figure 4:
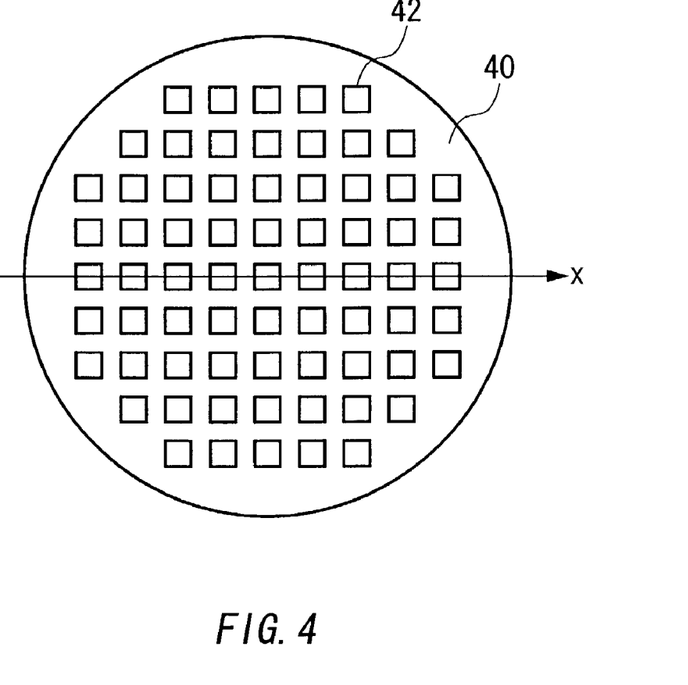
FIG. 4 is a top view of a wafer tested by the test device according to the present embodiment.

FIG. 4 is a top view of the wafer 40 tested by the test device 10 according to the present embodiment. The wafer 40 includes the plurality of electronic devices 42 arranged orderly. The measurement part 16 measures the data of each of the electronic devices 42 in association with the position in direction of x-axis in FIG. 4.

Figure 5:
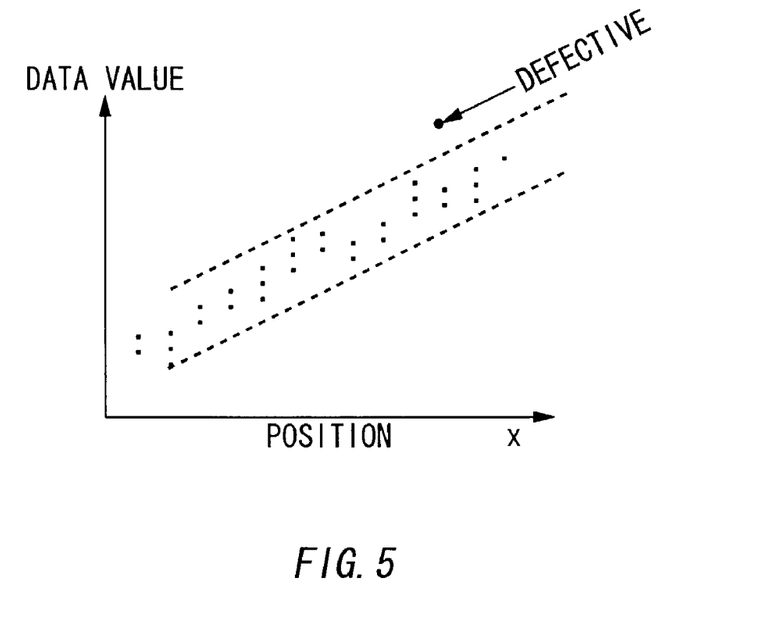
FIG. 5 is a graph exemplary showing the data values of the electronic devices to the position in direction of x-axis shown in FIG. 4.

FIG. 5 is a graph exemplary showing the data values of the electronic devices 42 to the position in direction of x-axis shown in FIG. 4. In FIG. 5, a horizontal axis shows the position of the electronic devices 42 in direction of x-axis in FIG. 4, and a vertical axis shows the data values of the electronic devices 42. As shown in FIG. 5, the data values of the electronic devices are in proportion to the positions. Based on the graph shown in FIG. 5, the calculation part 18 calculates an average straight line of the data value to the position of the electronic devices 42 in direction of the x-axis by method of least squares or the like. Then, the calculation part 18 judges the electronic device having a data value within a predetermined range from the average straight line to be normal, and judges the electronic device having a data value out of the predetermined range to be defective. The measurement part 16 measures the data of the electronic devices 42 in association with any direction of the electronic devices 42 on the wafer 40. For example, it is measured in association with a position from the center of the wafer 40. In this way, the acceptability of the electronic devices 42, of which the data values are different according to the position of each of the electronic devices 42 on the wafer 40, is judged appropriately.

Figure 6:
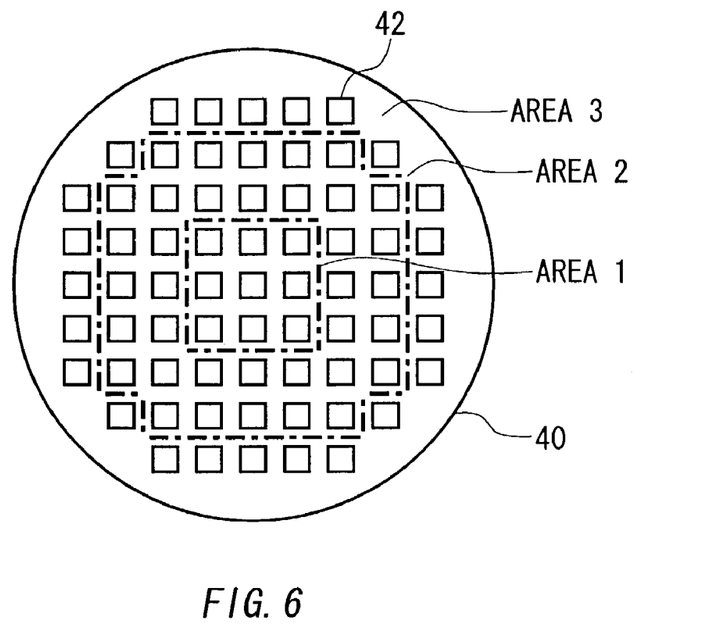
FIG. 6 is a top view of the wafer tested by the test device according to the present embodiment.

FIG. 6 is a top view of the wafer 40 tested by the test device 10 according to the present embodiment. The wafer 40 includes the plurality of electronic devices 42 arranged orderly. The calculation part 18 divides the wafer 40 into areas 1–3, and calculates the reference values for each of the areas 1–3.

Figure 7:
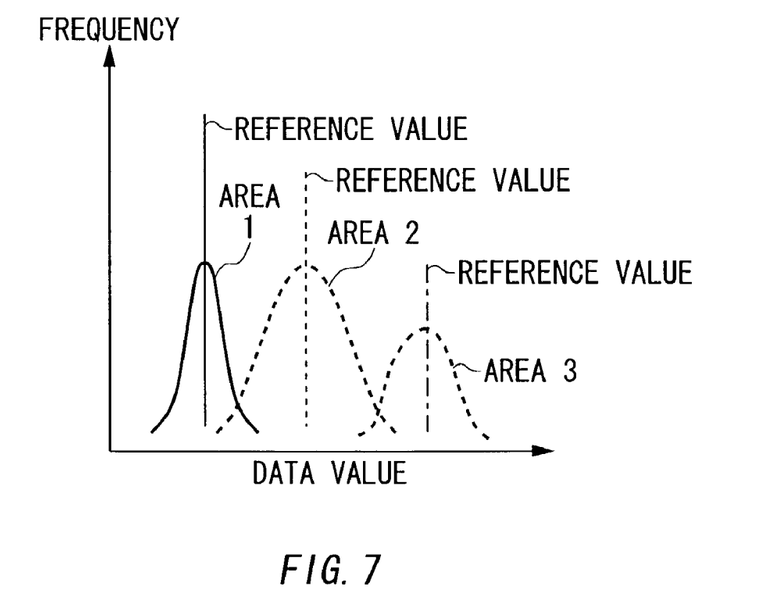
FIG. 7 is a graph exemplary showing a distribution of the data values for each of the areas shown in FIG. 6.

FIG. 7 is a graph exemplary showing a distribution of the data values for each of the areas shown in FIG. 6. The calculation part 18 calculates the reference values for each of the areas 1–3, and the judgment part 20 judges the acceptability of the electronic devices for each of the areas 1–3 based on each of the reference values.

Figure 8:
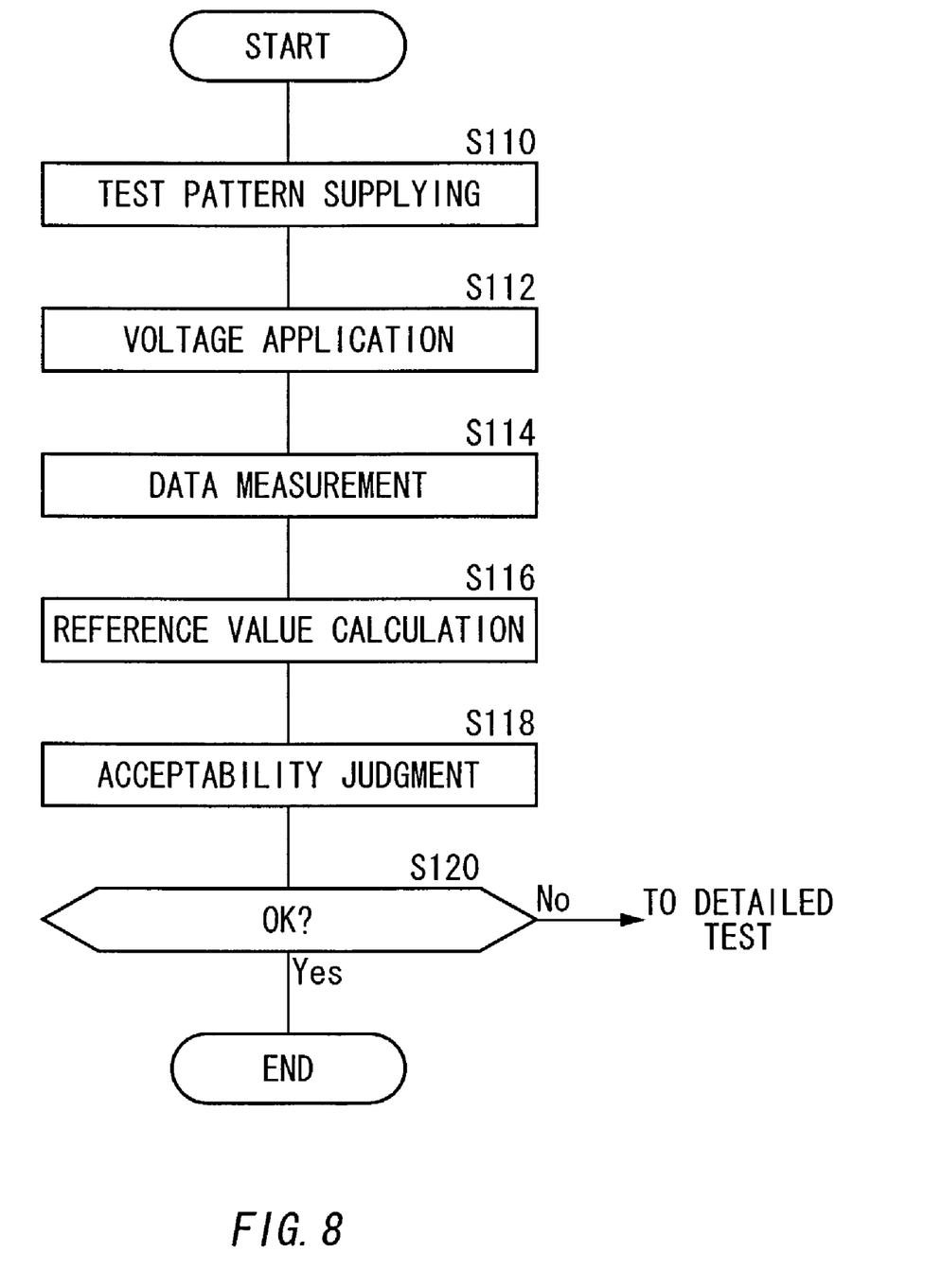
FIG. 8 is a flowchart showing a test operation of a plurality of electronic devices by the test device according to the present embodiment.

FIG. 8 is a flow chart showing a test operation of a plurality of electronic devices 42 by the test device 10 according to the present embodiment.

The pattern supply part 12 supplies the test pattern to each of the plurality of electronic devices 42 (S110). The power supply 14 applies the supply voltage to each of the plurality of electronic devices 42 (S112). The measurement part 16 measures the data indicating the operation of the electronic device generated by each of the electronic devices 42 by supplying the test pattern (S114). It is preferable that the measurement part 16 measures the data after a predetermined time has elapsed after the pattern supply part 12 started supplying of the test pattern until the data value of each of the electronic device 42 is stabilized. The calculation part 18 calculates the reference value based on the measurement data of the plurality of electronic devices 42 measured by the measurement part 16 (S116). The judgment part 20 judges the acceptability of each of the electronic devices 42 based on the reference value (S118). It is preferable that the electronic device 42, which is judged to be defective by the judgment part 20, is tested by a detailed test (S120).

According to the test device of the present embodiment, since the acceptability of each of the electronic device is judged using the measurement data of the plurality of electronic devices formed in the constant condition, the acceptability of the electronic devices, of which the data values change delicately, are judged accurately.

According to the test device of the present embodiment, since the acceptability of each of the electronic devices is judged using the measurement data of the plurality of electronic devices measured simultaneously in the constant condition, the acceptability of the electronic devices, of which the measurement data change with the differences in delicate measurement condition, are judged accurately.

As described above, according to the present invention, it is possible to reduce off-capacitance of the switch for switching-off the test device 10. Therefore, it is possible to test the electronic devices 42 more accurately.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A test device for testing a plurality of electronic devices formed on a wafer, comprising:

a pattern supply part for supplying a test pattern to each of the plurality of electronic devices;

a measurement part for measuring data indicating operation of each of the plurality of electronic devices generated from the test pattern;

a judgment part for judging acceptability of other electronic devices based on the data of at least one of the electronic devices among the plurality of electronic devices, wherein the data of each of the plurality of electronic devices is measured by the measurement part under the same condition and at the same time; and calculating a reference value for judging the acceptability of each of the plurality of electronic devices using the data of the plurality of electronic devices, wherein said judgment part judges the acceptability of each of the plurality of electronic devices using the reference value and the data of each of the plurality of electronic devices.

2. The test device as claimed in claim 1, where said calculation part selects an electronic device used for calculation of the reference value, and calculates the reference value using the data of the selected electronic device.

3. The test device as claimed in claim 1, wherein
said measurement part measures a value of current flowing to the plurality of electronic devices by supplying the test pattern, and
said calculation part calculates the reference value based on the current value measured by said measurement part.

4. The test device as claimed in claim 1, wherein said measurement part measures analog output values output from the plurality of electronic devices.

5. The test device as claimed in claim 4, wherein said measurement part further comprises an offset value storage part for storing an offset value of the analog output, and said calculation part calculates the reference value based on the offset value and the data.

6. The test device as claimed in the claim 1, wherein said measurement part measures a frequency of a signal output from the plurality of electronic devices.

7. The test device as claimed in claim 1, further comprising:
a data storing part for storing the data; and
a heating part for heating the electronic devices,
wherein said calculation part calculates the reference value based on the data stored in said data storing part and the data after heated by said heating part.

8. The test device as claimed in claim 1 further comprising a cooling part for cooling the electronic devices after heated by said heating part, wherein
said data storing part further stores the data after heated by said heating part, and
said calculation part calculates the reference value based on at least one of the data before and after heated by said heating part, the data being stored in said data storing part, and the data after cooled by said cooling part.

9. The test device as claimed in claim 1, wherein
said measurement part measures a position of each of the plurality of electronic devices on the wafer in association with the data, and
said judgment part judges the acceptability of each of the plurality of electronic devices based on the position.

10. The test device as claimed in claim 1, wherein said calculation part divides the wafer into a plurality of areas and calculates the reference value for each of these areas, and said judgment part judges the acceptability of the plurality of electronic devices for each of the areas.

11. The test device as claimed in claim 1, further comprising a wafer data storing part for storing the data for each of wafers, wherein
said measurement part measures the data of the plurality of wafers,
said wafer data storing part stores the data of the plurality of wafers respectively, and
said calculation part calculates the reference value based on the data stored in said wafer data storing part.

12. The test device as claimed in claim 11, wherein the plurality of wafers are manufactured in a production lot.

13. The test device as claimed in claim 1, wherein said judgment part judges the acceptability of the other devices based on a distribution of the measured data.

14. A test method for testing a plurality of electronic devices formed on a wafer, comprising steps of:
inputting a test pattern to each of the plurality of electronic devices;
measuring data indicating operation of each of the plurality of electronic devices generated from the test pattern;
judging acceptability of other electronic devices based on the data of at least one of the electronic devices among the plurality of electronic devices, wherein the data of each of the plurality of electronic devices is measured by the measurement part under the same condition and at the same time; and
calculating a reference value for judging the acceptability of each of the plurality of electronic devices using the data of the plurality of electronic devices,
wherein the acceptability of each of the electronic devices is judged in said judgment step using the reference value and the data of each of the electronic devices.

15. The test method of the electronic devices as claimed in claim 14, wherein a value of current flowing to the plurality of electronic devices is measured in said measurement step by supplying the test pattern, and the reference value is calculated in said calculation step based on the current value measured in said measurement step.

16. The test method of the electronic devices as claimed in claim 14, further comprising a step of heating the electronic devices,
wherein the reference value is calculated in said calculating step based on the data measured in said measurement step after heating the electronic device in said heating step.

17. The test method of the electronic devices as claimed in claim 14, wherein a position of each of the plurality of electronic devices on the wafer is measured in said measurement step in association with the data, and the acceptability of each of the plurality of electronic devices is judged in said judgment step based on the position on the wafer.

18. The test method of the electronic devices as claimed in claim 14, wherein said judging judges the acceptability of the other devices based on a distribution of the measured data.

* * * * *

UNITED STATES PATENT AND TRADEMARK OFFICE
CERTIFICATE OF CORRECTION

| | |
|---|---|
| PATENT NO. | : 7,071,721 B2 |
| APPLICATION NO. | : 10/440754 |
| DATED | : July 4, 2006 |
| INVENTOR(S) | : Yasuo Furukawa |

It is certified that error appears in the above-identified patent and that said Letters Patent is hereby corrected as shown below:

On the Title page

Under References Cited, add Item--(74) *Attorney, Agent, or Firm—Osha Liang L.L.P*--.

Signed and Sealed this

Thirty-first Day of July, 2007

JON W. DUDAS
*Director of the United States Patent and Trademark Office*